(12) United States Patent
Akiyama et al.

(10) Patent No.: US 10,511,301 B2
(45) Date of Patent: Dec. 17, 2019

(54) GATE DRIVE CIRCUIT, POWER CONVERSION APPARATUS, AND RAILWAY VEHICLE

(71) Applicant: HITACHI, LTD., Tokyo (JP)

(72) Inventors: Satoru Akiyama, Tokyo (JP); Ryuusei Fujita, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 16 days.

(21) Appl. No.: 15/777,126

(22) PCT Filed: Jun. 24, 2016

(86) PCT No.: PCT/JP2016/068893
§ 371 (c)(1),
(2) Date: May 17, 2018

(87) PCT Pub. No.: WO2017/221417
PCT Pub. Date: Dec. 28, 2017

(65) Prior Publication Data
US 2018/0375509 A1 Dec. 27, 2018

(51) Int. Cl.
*H02M 1/08* (2006.01)
*H03K 17/16* (2006.01)
(Continued)

(52) U.S. Cl.
CPC ............ *H03K 17/162* (2013.01); *B61C 3/00* (2013.01); *H02M 1/08* (2013.01); *H02M 7/5387* (2013.01); *H02P 27/06* (2013.01); *H03K 17/168* (2013.01)

(58) Field of Classification Search
CPC .............................. H02M 1/08; H03K 17/162
See application file for complete search history.

(56) References Cited

U.S. PATENT DOCUMENTS

| 5,977,814 A | 11/1999 | Ishii |
| 6,271,709 B1 | 8/2001 | Kimura et al. |
| 2014/0285241 A1 | 9/2014 | Umetani |

FOREIGN PATENT DOCUMENTS

| JP | H10-234186 A | 9/1998 |
| JP | H10-313570 A | 11/1998 |

(Continued)

OTHER PUBLICATIONS

International Search Report dated Sep. 13, 2016 of the PCT International Application No. PCTJP2016/068893.

*Primary Examiner* — Bickey Dhakal
*Assistant Examiner* — Cortez M Cook
(74) *Attorney, Agent, or Firm* — Volpe and Koenig, P.C.

(57) ABSTRACT

A gate drive circuit to prevent a false turn-on phenomenon includes a first, second, third and fourth switching element, and a capacitor. A source of the first switching element is connected to a first voltage, and a drain of the same is connected to the main switching element's gate electrode. A source of the second switching element is connected to a second voltage, and a drain of the same is connected to the gate electrode. A source of the third switching element is connected to the first voltage, and a drain of the same is connected to a first electrode of the capacitor. A source of the fourth switching element is connected to the second voltage, and a drain of the same is connected to the first electrode and to the drain of the third switching element. A second electrode of the capacitor is connected to the gate electrode.

12 Claims, 10 Drawing Sheets

(51) Int. Cl.
*B61C 3/00* (2006.01)
*H02M 7/5387* (2007.01)
*H02P 27/06* (2006.01)

(56) References Cited

FOREIGN PATENT DOCUMENTS

| | | | |
|---|---|---|---|
| JP | 2000-228868 A | | 8/2000 |
| JP | 2000-333441 A | | 11/2000 |
| JP | 2000333441 A | * | 11/2000 |
| JP | 2007-088599 A | | 4/2007 |
| JP | 2007088599 A | * | 4/2007 |
| JP | 2009-213305 A | | 9/2009 |
| JP | 2014-187479 A | | 10/2014 |
| JP | 2016-077135 A | | 5/2016 |

* cited by examiner

GATE DRIVE CIRCUIT, POWER CONVERSION APPARATUS, AND RAILWAY VEHICLE

TECHNICAL FIELD

The present invention relates to a gate drive circuit, a power conversion apparatus, and a railway vehicle. More particularly, the present invention relates to a technique effectively applied to a driving circuit that drives a power device using a silicon carbide material, etc.

BACKGROUND ART

For example, Patent Document 1 describes a configuration in which, in order to simply switch a switching speed (dv/dt: voltage change rate) of an insulated-gate bipolar transistor (IGBT) between a high-speed mode and a low-speed mode, a capacitor and a switch are connected in series between a gate and an emitter of this insulated-gate bipolar transistor.

Patent Document 2 describes a configuration in which, in order to detect an abnormal current flowing through a switching element for power conversion to protect this switching element, a capacitor and a protective switching element are connected in series between a gate and an emitter of the switching element.

RELATED ART DOCUMENTS

Patent Documents

Patent Document 1: Japanese Patent Application Laid-open

Patent Document 2: Japanese Patent Application Laid-open Publication No. 2009-213305

SUMMARY OF THE INVENTION

Problems to be Solved by the Invention

For example, as application of a power device, a so-called inverter device (DC/AC converter device) shown as an inverter 13 in FIG. 1 of the above-described Patent Document 2 is generally cited. In an inverter device, a reflux diode element and a switching element made of a power device are connected in series between a power supply on to high-voltage side (upper arm) and a power supply on a low-voltage side (lower arm). These switching elements of the upper and lower arms are alternately turned on and off, so that a DC level at the former stage of the inverter is converted into an AC level, and the AC is supplied to a load circuit such as an AC isolation transformer and a motor at the latter stage.

As an element expected to be used as such a switching element, an SiC MOSFET and an SiC IGBT using silicon carbide (SiC) are cited. The SiC MOSFET and the SiC IGBT are almost the same in an element structure with an existing power device such as an Si MOSFET and an Si IGBT using silicon (Si), and are the same in a method of driving them therewith. In other words, for the SiC element, an existing gate drive circuit for the Si element can be basically used, and therefore, the SiC element is convenient.

Further, the SiC element has a lower on-resistance than that of the Si element, and therefore, also has an advantage capable of reducing a loss resulting from an inverter operation. However, the SiC element has a smaller substrate film thickness than that of the Si element, and therefore, has such a problem as so-called large input capacitance.

Therefore, by the usage of the driving circuit for the Si element as the driving circuit for the SiC element without careful consideration, the input capacitance is increased, and, as a result, the switching speed is decreased in some cases. The decrease in the switching speed leads to increase in the switching loss, and there is a possibility of deterioration in a conversion efficiency of a power conversion apparatus.

As means for preventing the decrease in the switching speed, decrease in a value of a gate resistance connected in series to a gate terminal of the switching element is generally cited. By the decrease in the value of the gate resistance, the input capacitance of the switching element can be charged/discharged at a high speed, and therefore, controllability of the switching speed of an element with a large input capacitance such as the SiC element is improved.

However, when the switching speed becomes high by the decrease in the gate resistance value, the input capacitance is charged/discharged in a short time, and therefore, a gate current significantly increases. The increase in the gate current causes a risk of deterioration of a resistor and a capacitor which are passive elements in the gate drive circuit. Further, it is required to enhance an output current at an output stage of the gate drive circuit in accordance with the increase in the gate current, and therefore, there is a problem of increase in a cost of the gate drive circuit.

As means for solving such problems, a method of switching the switching speed mode as disclosed in the above-described Patent Document 1 is cited. According to the method of the Patent Document 1, an external capacitor does not effectively function as a capacitance during a high-speed switching mod, and therefore, charge/discharge currents of the external capacitor is reduced, and, as a result, a total gate current can be reduced.

Meanwhile, according to the method disclosed in the Patent Document 1, the capacitive value of the external capacitor is effectively reduced in the high-speed switching mode, and therefore, such a problem as so-called false turn-on phenomenon cannot be solved.

The false turn-on phenomenon is caused when, for example, a state of the upper arm of the inverter changes from the off-state to the on-state as the lower arm is turned off off. In this case, a drain voltage at the lower arm rapidly increases, so that the charge/discharge current flow in the capacitance between the gate and the drain of the switching element of the lower arm. As a result, a voltage between the gate and the source of the switching element of the lower arm increases from its voltage level of the off-state. Once the voltage level exceeds a threshold of the switching element, the switching element of the lower arm is erroneously turned on, a state of which is supposed to be the off-state.

As described above, the false turn-on phenomenon is a phenomenon that erroneously turns on the switching element, a state of which is supposed to be the off-state. The false turn-on phenomenon may be caused also when the Si element is used as the switching element of the lower arm. However, particularly when the SiC element is used, the input capacitance, particularly a feedback capacitance, is large, and therefore, the above-described charge/discharge current flowing in the capacitance between the gate and the drain becomes large, and the false turn-on phenomenon tends to occur.

An object of the present invention has been made in consideration of the above-described circumstances, and is to provide a technique capable of suppressing a gate driving current to prevent a false turn-on phenomenon in a driving circuit that drives a power device.

The above and other objects and novel characteristics of the present invention will be apparent from the description of the present specification and the accompanying drawings.

Means for Solving the Problems

The summary of the typical aspects of the inventions disclosed in the present application will be briefly described as follows.

A gate drive circuit according to one embodiment is a gate drive circuit drives a main switching element. The gate drive circuit includes a first switching element, a second switching element, a third switching element, a fourth switching element, and a capacitor. A source of the first switching element is connected to a first voltage, and a drain of the same is connected to a gate electrode of the main switching element. A source of the second switching element is connected to a second voltage, and a drain of the same is connected to the gate electrode of the main switching element. A source of the third switching element is connected to the first voltage, and a drain of the same is connected to a first electrode of the capacitor. A source of the fourth switching element is connected to the second voltage, and a drain of the same is connected to the first electrode of the capacitor and to the drain of the third switching element. A second electrode of the capacitor is connected to the gate electrode of the main switching element.

A power conversion apparatus according to the one embodiment includes: three paired first main switching elements and second main switching elements, each pair of which are for a U phase, a V phase, or a W phase and are connected in series between a power supply on a high-voltage side and a power supply on a low-voltage side; and three paired first gate drive circuits and second gate drive circuits, each pair of which are for the U phase, the V phase, or the W phase and alternately turn each of the three paired first and second main switching elements on and off. Each of the first gate drive circuits and the second gate drive circuits is the above-described gate drive circuit according to the one embodiment.

A railway vehicle according to the one embodiment is a railway vehicle having a power converter driving a three-phase motor. The power converter includes an inverter converting a direct-current power, which is created by converting an alternate-current power that is input from an alternate-current overhead wire, into an alternate-current power to be supplied to the three-phase motor. The invertor includes: three paired first main switching elements and second main switching elements, each pair of which are for a U phase, a V phase, or a W phase and are connected in series between a power supply on a high-voltage side and a power supply on a low-voltage side; and three paired first gate drive circuits and second gate drive circuits, each pair of which are for a U phase, a V phase, or a W phase and alternately turn the three paired first and second main switching elements on and off. Each of the first gate drive circuits and the second gate drive circuits is the above-described gate drive circuit according to the one embodiment.

Effects of the Invention

The effects obtained by the typical aspects of the present invention will be briefly described below.

(1) In a drive circuit that drives a power device, a gate drive current can be suppressed.

(2) A false turn-on phenomenon can be prevented.

BRIEF DESCRIPTIONS OF THE DRAWINGS

BEST MODE FOR CARRYING OUT THE INVENTION

Figure 1:
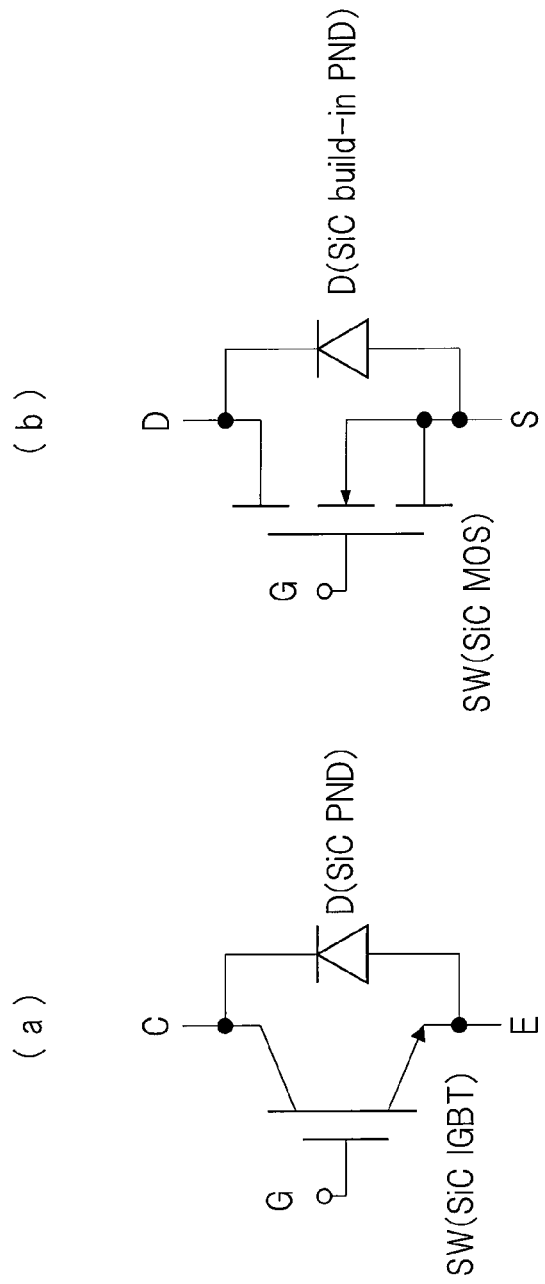
FIG. 1 is explanatory diagrams each showing an example of a semiconductor switching element used in a gate drive circuit according to an embodiment, in which (a) shows an SiCIGBT and (b) shows an SiCMOS.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, the same components are denoted by the same reference symbols in principle throughout all the drawings for describing the embodiments, and the repetitive description thereof is omitted. In order to make the drawings easy to see, note that hatching is used even in a plan view while hatching is omitted even in a cross-sectional view in some cases.

In the embodiments, note that a MOSFET (Metal Oxide Semiconductor Field Effect Transistor) is used as an example of a MISFET (Metal Insulator Semiconductor Field Effect Transistor). However, a non-oxide film serving as a gate insulating film is not excluded.

The embodiments will be described in detail based on drawings below. In order to easily understand features of the embodiments, a margin for improvement existing in related arts will be described first.

[Margin for Improvement]

In a major social trend of global environment preservation, importance of electronics business that reduces environmental loads has increased. Power devices are particularly used for inverters of railway vehicles and hybrid/electric cars, inverters of air conditioners, and power supplies of consumer products as personal computers, and therefore, improvement in performances of the power devices significantly contributes to improvement in power efficiencies of infrastructure systems and consumer products.

The improvement in the power efficiencies means reduction in energy resources required for system operations. In other words, emission amounts of carbon dioxides can be reduced, that is, environmental loads can be reduced. For this reason, research and development activities aiming at the improvement in the performance of the power device have been actively performed.

Generally, the power device is made of silicon (Si) as similar to a large-scale integrated circuit (LSI). In a power conversion apparatus using such an Si power device, such as an inverter, in order to reduce its energy loss, research and development for achieving properties such as low on-resistance (Ron), a high current density, and a high breakdown voltage by optimizing profiles of element structures of diode elements and switching elements and impurity concentrations thereof have been actively performed.

In recent years, attention has been paid to compound semiconductors made of silicon carbide (SiC), gallium nitride (GaN), etc., having a larger band gap than that of silicon, as power device materials. Each of these compound semiconductors has such a large bandgap, and therefore, has a breakdown voltage that is about 10 times as high as that of silicon.

For this reason, such a compound device can have a smaller thickness than that of a Si device, and have a much lower resistance value (Ron) in a conduction-state. As a result, so-called conduction loss (Ron×$i^2$) expressed by a product of the resistance value (Ron) and a conduction current (i) can be reduced, so that this manner can significantly contribute to the improvement in the power efficiency. As attention is paid to such advantages, the diode elements and the switching elements using the compound materials have been actively researched and developed.

As application of such a power device, for example, a so-called inverter (DC/AC converter) as shown in an inverter 13 of FIG. 1 of the above-described Patent Document 2 is generally cited. In an inverter device, a switching element made of a power device and a reflux diode element are connected in series between a power supply on to high-voltage side (upper arm) and a power supply on a low-voltage side (lower arm). These switching elements of the upper and lower arms are alternately turned on and off, so that a DC level at the former stage of the inverter is converted into an AC level, and the AC is supplied to a load circuit such as an AC isolation transformer and a motor at the latter stage.

In this case, as losses caused in the inverter, a conduction loss and a recovery loss based on the on-resistances (Ron) of the switching element and the diode element as described above, and a switching loss are mainly cited, the switching loss being caused by the switching operation, that is, by the current flow between the source and the drain during a period in which the switching element shifts from its on-state to off-state or from its off-state to on-state (period in which a potential difference is caused between the drain and the source). As elements expected to be used as such a switching element, an SiC MOSFET (which will hereinafter be described as SiCMOS) and SiC IGBT (which will hereinafter be described as SiCIGBT) using SIC are cited.

The SiCMOS and SiCIGBT are almost the same in an element structure with existing power devices such a Si MOSFET and a Si IGBT using silicon, and are the same also in a drive method with them. In other words, an existing gate drive circuit for the Si element can be basically also used for the SiC element, and therefore, is convenient.

Further, the SiC element has a lower on-resistance than that of the Si element, and therefore, also has an advantage of reduction in the losses resulting from the inverter operations. However, the SiC element has a smaller substrate film thickness than that of the Si element, thus has a problem of increase in so-called input capacitance (Ciss).

Therefore, by the usage of the drive circuit for the Si element as the drive circuit for the SiC element without careful consideration, the input capacitance is increased, and, as a result, the switching speed (dv/dt) is decreased in some cases. The decrease in the switching speed leads to increase in the switching losses, and therefore, there is a possibility of deterioration of the conversion efficiency of the power conversion apparatus.

As means for preventing the decrease in the switching speed, decrease in a value of a gate resistor connected in series to the gate terminal of the switching element is generally cited. By the decrease in the value of the gate resistor, the input capacitance of the switching element can be charged/discharged at a high speed, and therefore, controllability of the switching speed of the element such as the SiC element having the large input capacitance is improved.

However, by the increase in the switching speed because of the decrease in the value of the gate resistor, the input capacitance is charged/discharged in a short time, and therefore, a gate current significantly increases. The increase in the gate current causes a risk of deterioration of a resistor and a capacitor which are passive elements in the gate drive circuit. Further, it is required to enhance an output current at an output stage of the gate drive circuit in accordance with the increase in the gate current, and therefore, a problem of increase in a cost of the gate drive circuit arises.

As means for solving such problems, a method of switching the switching speed mode as disclosed in the above-described Patent Document 1 is cited. According to the method of the Patent Document 1, an external capacitor does not effectively function as a capacitance during a high-speed switching mod, and therefore, charge/discharge currents of the external capacitor is reduced, and, as a result, a total gate current can be reduced.

Meanwhile, according to the method disclosed in the Patent Document 1, the capacitive value of the external capacitor is effectively reduced in the high-speed switching mode, and therefore, such a problem as so-called false turn-on phenomenon cannot be solved.

The false turn-on phenomenon is caused when, for example, a state of the upper arm of the inverter changes from the off-state to the on-state as the lower arm is turned off. In this case, a drain voltage at the lower arm steeply increases, so that the charge/discharge current flow in the capacitance between the gate and the drain of the switching element of the lower arm. As a result, a voltage between the gate and the source of the switching element of the lower arm increases from its voltage level of the off-state. Once the voltage level exceeds a threshold of the switching element, the switching element of the lower arm is erroneously turned on, a state of which is supposed to be the off-state.

As described above, the false turn-on phenomenon is a phenomenon that erroneously turns on the switching element, a state of which is supposed to be the off-state. The false turn-on phenomenon may be caused also when the Si element is used as the switching element of the lower arm. However, particularly when the SiC element is used, the input capacitance (Ciss), particularly a feedback capacitance (Crss), is large, and therefore, the above-described charge/discharge current flowing in the capacitance between the gate and the drain becomes large, and the false turn-on phenomenon tends to occur.

Accordingly, the embodiment provides a contrived technique for the improvement margin existing in the above-described related arts. A technical concept of the contrived embodiment will be explained below with reference to drawings. The technical concept of the embodiment is to provide a technique, in a drive circuit that drives a power device, capable of suppressing a gate drive current to prevent a false turn-on phenomenon.

More specifically, the SiC element has a large input capacitance and a large feedback capacitance, and therefore, has a possibility of the decrease in the switching speed. Therefore, both of achievement of the high-speed switching as suppressing the increase in the gate drive current in order to prevent the increase in the cost of the gate drive circuit and achievement of such a stable switching operation as not causing the false turn-on phenomenon are the means for achieving the decrease in the cost and the decrease in the loss of the entire power conversion apparatus. Further, a technique for suppressing the gate drive current, preventing the false turn-on phenomenon, decreasing the losses, and improving the reliability is provided.

[Embodiment]

A gate drive circuit, a power conversion apparatus, and a railway vehicle according to the embodiment will be described with reference to FIGS. 1 to 10. In the embodiment, a semiconductor switching element is referred to also simply as switching element or switch, and a semiconductor diode element is referred to also simply as diode element or diode.

<Configuration of Gate Drive Circuit>

FIG. 1 is explanatory diagrams each showing an example of the semiconductor switching element used in the gate drive circuit according to the embodiment. In FIG. 1, FIG. 1(a) shows the SiCIGBT and FIG. 1(b) shows an SiCMOS as an example of the switching element SW as examples of a switching element SW.

The SiCIGBT is a switching element SW with three terminals having a gate electrode G, a collector electrode C, and an emitter electrode E. The SiCMOS is a switching element SW with three terminals having a gate electrode G, a drain electrode D, and a source electrode S. In application to a gate drive circuit of a power conversion apparatus described later (in FIG. 9), the switching element SW shown in FIG. 1(a) is shown with a diode element D (SiC PND) necessary for a reflux operation in the drawing. The switching element SW (SiCMOS) shown in FIG. 1(b) has a built-in diode element therein in its structure, and therefore, is shown with a diode element D (SiC build-in PND).

Figure 2:
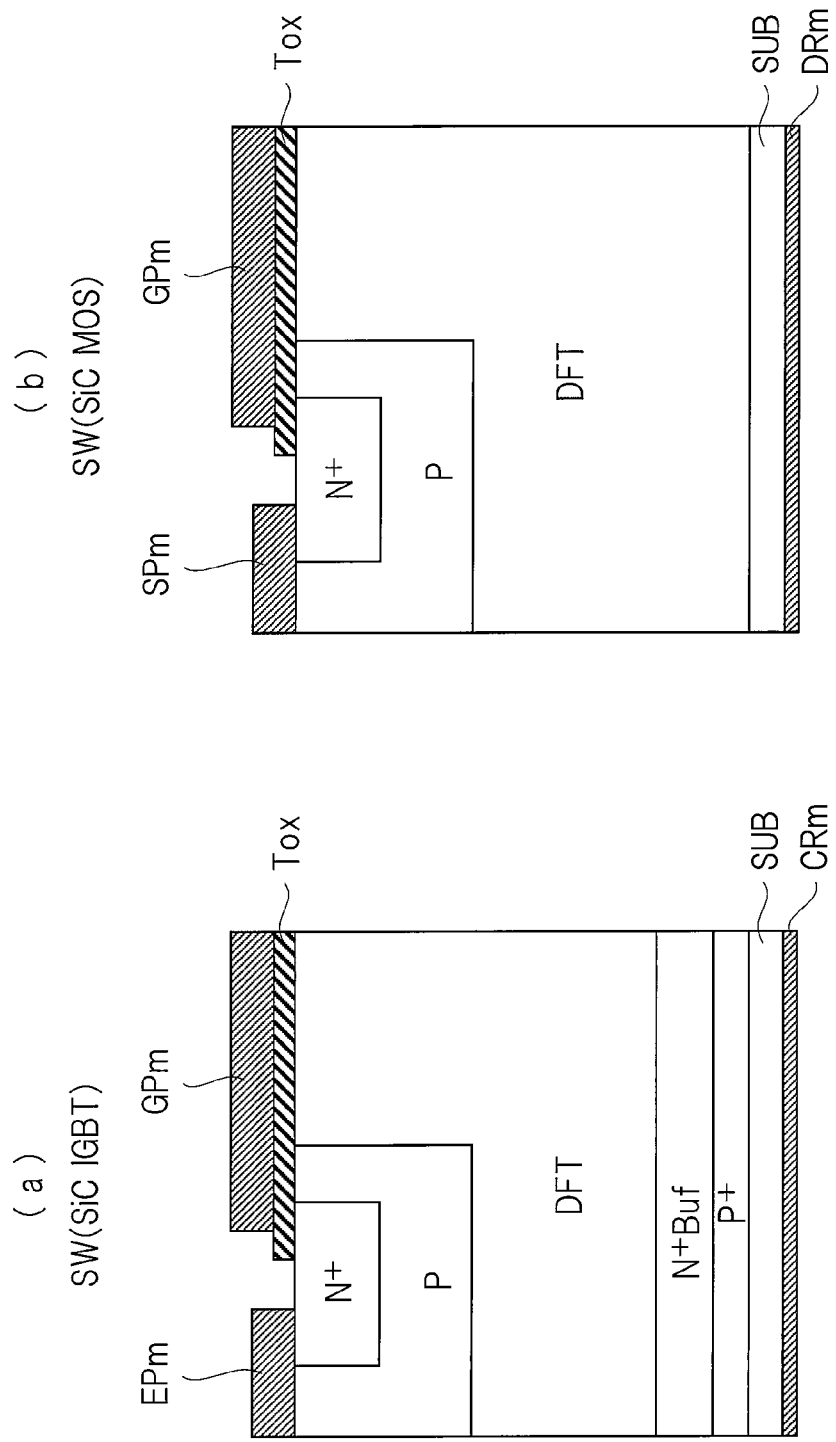
FIG. 2 is explanatory diagrams each showing an example of a cross-sectional structure of the semiconductor switching element of FIG. 1, in which (a) shows a cross-sectional structure of the SiCIGBT and (b) shows a cross-sectional structure of the SiCMOS.
Figure 3:
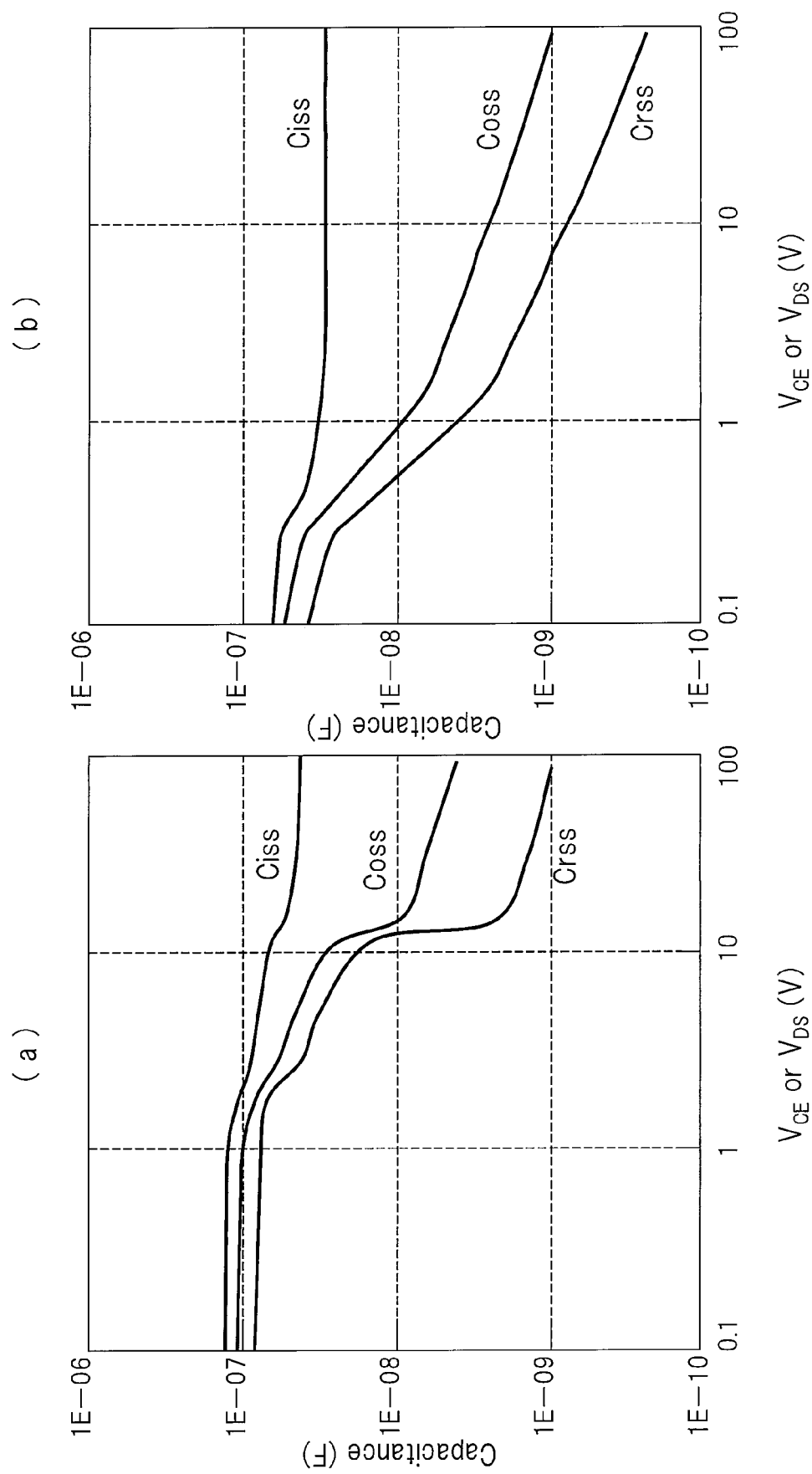
FIG. 3(a) is an explanatory diagram showing an example of a capacitive property of the semiconductor switching element of FIG. 1.
FIG. 3(b) is an explanatory diagram showing a capacitive property of a conventional semiconductor switching element using a silicon material.

FIG. 2 is explanatory diagrams each showing an example of a cross-sectional structure of the semiconductor switching element of FIG. 1. In FIG. 2, FIG. 2(a) shows a cross-sectional structure of the SiCIGBT and FIG. 2(b) shows a cross-sectional structure of the SiCMOS so as to correspond to the switching element SW shown in FIG. 1.

First, the SiCMOS shown in FIG. 2(b) will be described. The SiCMOS is a semiconductor switching element SW formed of a MOSFET made of an SiC compound material. FIG. 2(b) shows a SiCMOS of so-called DMOS (Double Diffusion Metal Oxide Semiconductor) type. In FIG. 2(b), SPm denotes a source electrode, GPm denotes a gate electrode, DRm denotes a drain electrode, SUB denotes a substrate, Tox denotes a gate insulating film, $N^+$ denotes a source layer, P denotes a base layer, and DFT denotes a drift layer.

In the SiCMOS shown in FIG. 2(b), the source layer $N^+$, which is formed as an $n^+$-type region connected to the source electrode SPm, is connected to the drift layer DFT via a channel formed in the base layer P which is formed as a p-type region. The drift layer DFT is, for example, an $n^-$-type region, and plays a role of securing a breakdown voltage. The substrate SUB is, for example, an $n^+$-type region, and the drain electrode DRm is connected to the substrate SUB. Although not shown in the drawings, note that the source electrode SPm, the gate electrode GPm, and the drain electrode DRm are connected to electrode pads, respectively, by using metal wiring layers. The base layer P and the drift layer DFT have a function of the built-in diode element. This SiCMOS has a simple element structure, and therefore, has an advantage of a lower manufacturing cost than that of an SiCMOS of a trench structure type. Therefore, a power converter with a low cost and a low loss can be achieved.

The SiCIGBT shown in FIG. 2(a) is a semiconductor switching element SW formed of an IGBT (Insulated Gate Bipolar Transistor) made of an SiC compound material. The SiCIGBT of FIG. 2(a) is different from the SiCMOS in that the source electrode SPm and the drain electrode DRm are replaced with the emitter electrode EPm and the collector electrode CRm, respectively, and in that a buffer layer $N^+$Buf and a high-concentration $P^+$ layer with a are formed between the drift layer DFT and the substrate SUB. Because of the existence of the high-concentration $P^+$ layer, a conductivity modulation phenomenon is caused, and the on-resistance drastically decreases. By application of the buffer layer $N^+$Buf as needed, the switching loss of the element can be decreased. In this manner, the SiCIGBT structure is more complicate and requires a higher cost for element formation than those of the SiCMOS structure. However, when the SiCIGBT structure is used for a converter for a railway vehicle, etc., requiring a large current, the SiCIGBT structure has an advantage of reducing the loss of the converter because the on-resistance and the switching can be decreased.

FIG. 3(a) is an explanatory diagram showing an example of the capacitive property of the semiconductor switching element of FIG. 1. And, FIG. 3(b) is an explanatory diagram showing a capacitive property of a semiconductor switching element using a conventional silicon material for comparison. In FIG. 3(a), the horizontal axis represents a collector-emitter voltage $V_{CE}$ in the case of the SiCIGBT structure or a drain-source voltage $V_{DS}$ in the case of the SiCMOS structure while the vertical axis represents a capacitive value. In FIG. 3(b), the horizontal axis represents a collector-emitter voltage $V_{CE}$ in the case of an Si IGBT structure or a drain-source voltage $V_{DS}$ in the case of an Si MOSFET structure while the vertical axis represents a capacitive value. FIGS. 3(a) and (b) show an input capacitance Ciss, an output capacitance Coss, and a feedback capacitance Crss.

A thickness of the drift layer DFT of the SiC element (SiCIGBT, SiCMOS) shown in the cross-sectional views of FIGS. 2(a) and (b) is about 1/10 of a thickness of the drift layer of the Si element (Si IGBT, Si MOSFET) with the same breakdown voltage. Therefore, in the SiC element, the feedback capacitance Crss of the capacitive property, that is, a capacitive component proportional in an amount to the thickness of the drift layer, becomes large. In general, in the SiC element, in order to secure its electric properties such as the on-voltage and the on-resistance, a thickness of a gate insulating film Tox is also designed to be thinner than that of the Si element. As a result, the input capacitance Ciss proportional in an amount to the capacitance of the gate insulating film also increases. That is, when an SiC power module having the same current capacity with that of an Si power module is designed, the capacitive value of the SiC power module increases by several times as large as that of the Si power module as clearly understood from comparison between FIGS. 3(a) and 3(b). For this reason, if a gate drive circuit used in the Si power module is used as a gate drive circuit for the SiC power module without careful consideration, there is a possibility of occurrence of malfunction such as the decrease in the switching speed and the false turn-on phenomenon.

Figure 4:
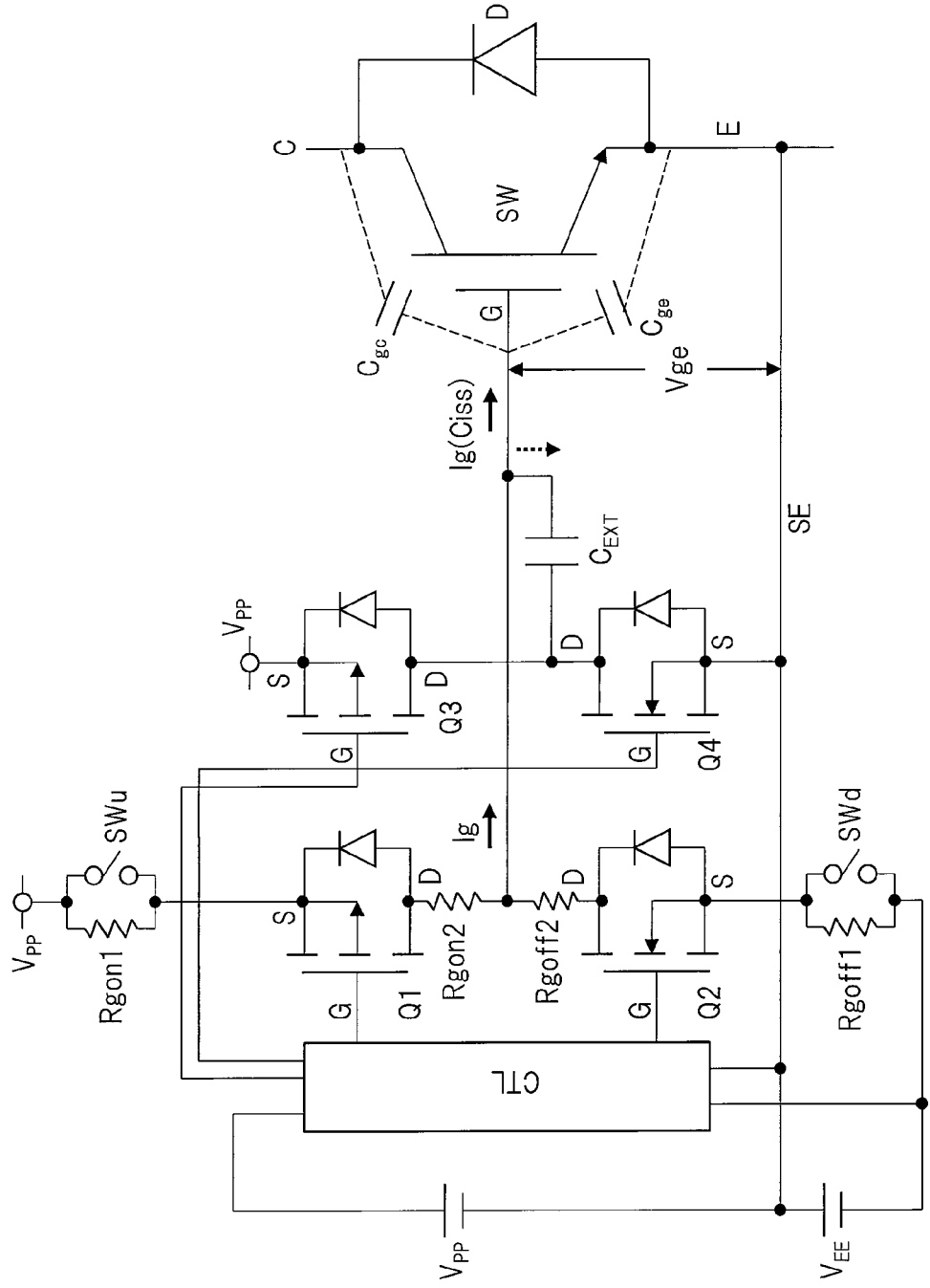
FIG. 4 is a circuit diagram showing an example of an operation mode (t1) of the gate drive circuit of the embodiment.
Figure 5:
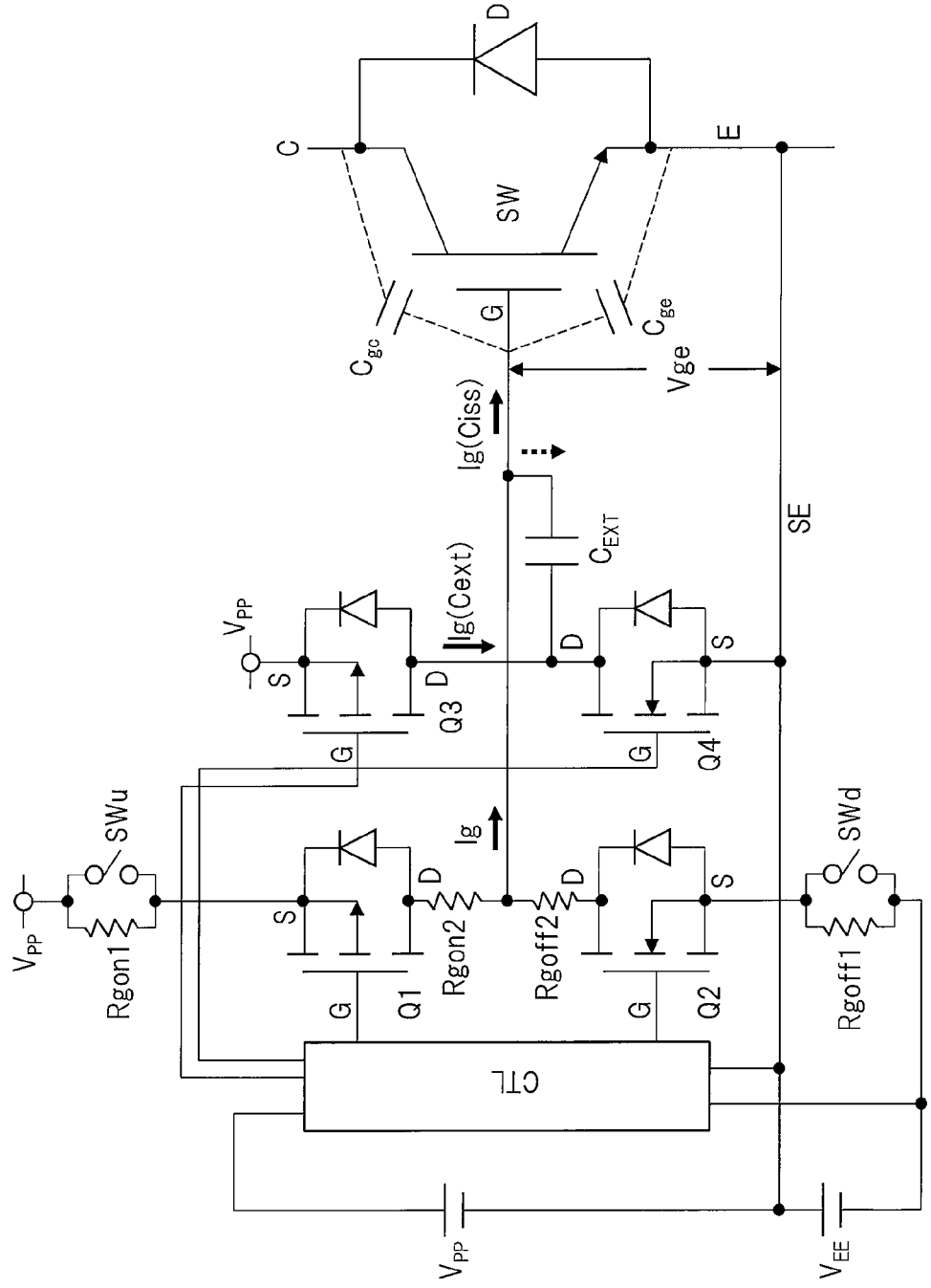
FIG. 5 is a circuit diagram showing an example of an operation mode (t2) of the gate drive circuit of the embodiment.
Figure 6:
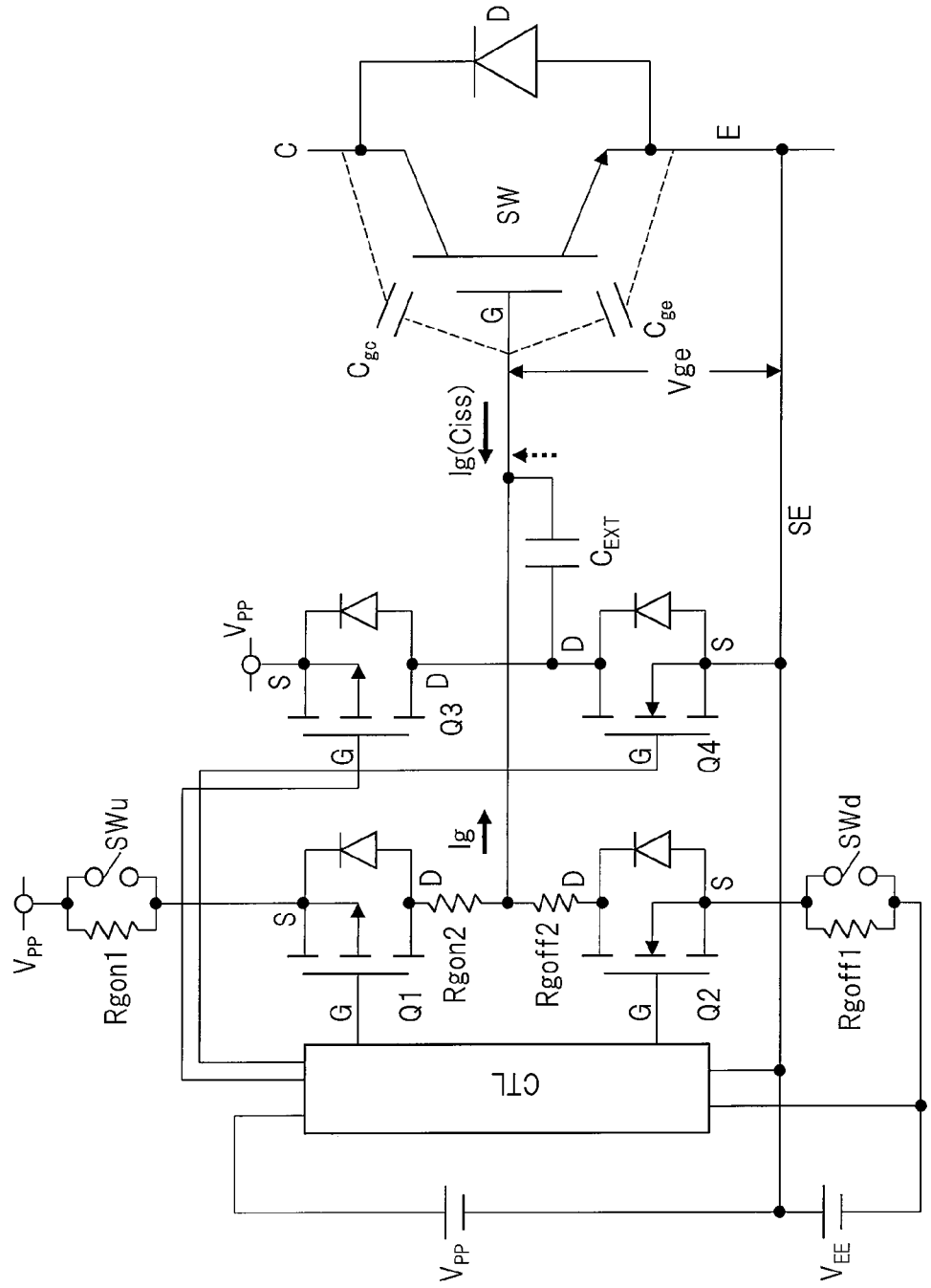
FIG. 6 is a circuit diagram showing an example of an operation mode (t3) of the gate drive circuit of the embodiment.
Figure 7:
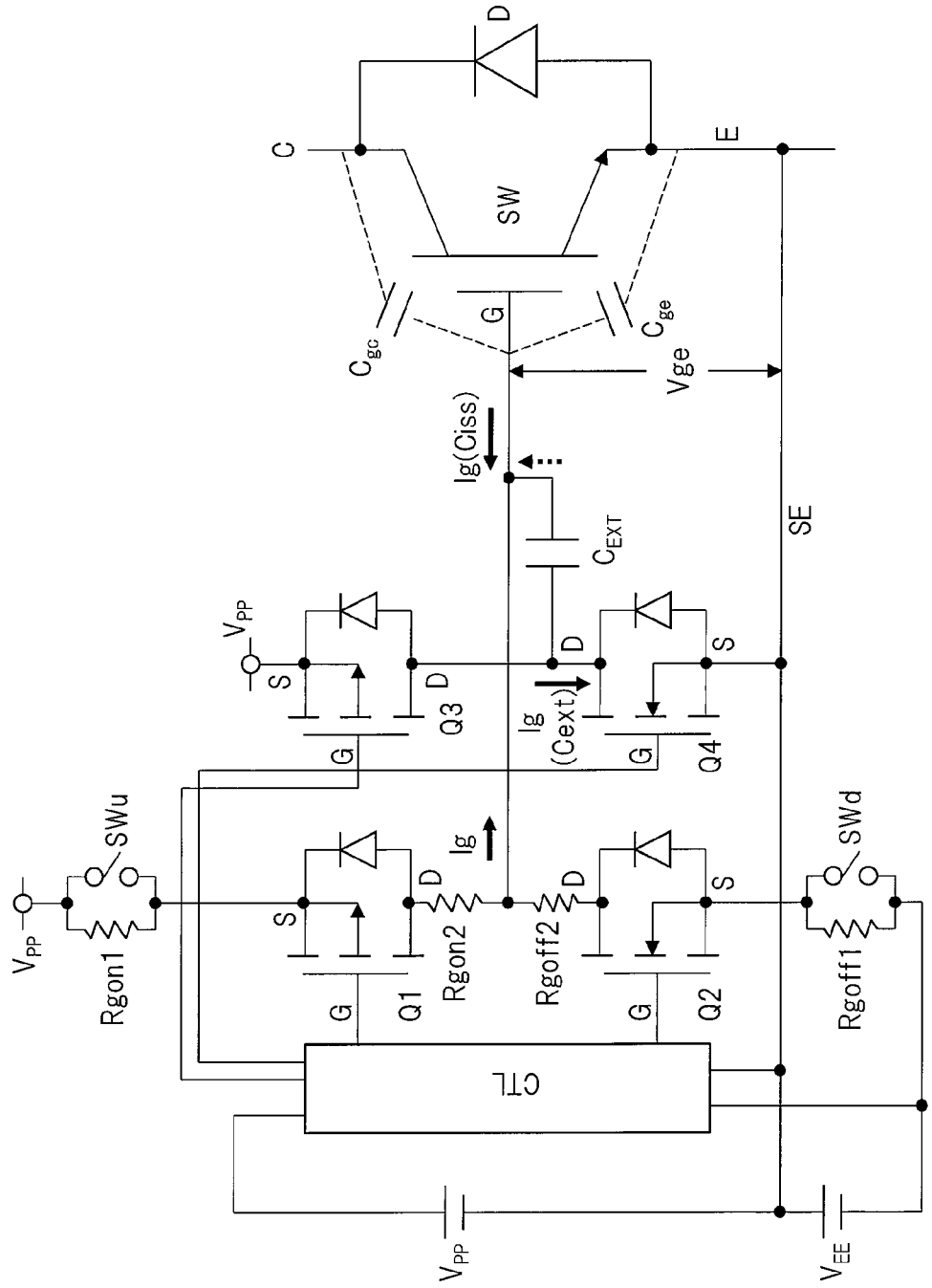
FIG. 7 is a circuit diagram showing an example of an operation mode (t4) of the gate drive circuit of the embodiment.

In order to prevent the malfunction, according to the present embodiment, a circuit configuration of the gate drive circuit is contrived, and besides, an operation sequence of the switching element which is a constituent element is improved contrived. First, the circuit configuration of the gate drive circuit of the present embodiment will be described with reference to FIG. 4 (FIGS. 5 to 7 are the same in the circuit configuration).

The gate drive circuit according to the present embodiment is an example of the drive circuit that drives the SiCIGBT shown in FIGS. 1(a) and 2(a). Obviously, it is needless to say that the example can be also applied to the drive circuit that drives the SiCMOS shown in FIGS. 1(b) and 2(b). In FIG. 4, the SiCIGBT which is the semiconductor switching element SW is referred to as main switching element, and an SiCIGBT having a reflux diode element SiCPND which is the semiconductor diode element D is described as an example.

As shown in FIG. 4, the gate drive circuit according to the present embodiment includes a first switching element Q1, a second switching element Q2, a third switching element Q3, a fourth switching element Q4, and a capacitor $C_{EXT}$.

A source of the first switching element Q1 is connected to a first voltage $V_{PP}$, and a drain of the same is connected to the gate electrode of the main switching element SW controlled by the gate drive circuit. A source of the second switching element Q2 is connected to a second voltage $V_{EE}$, and a drain of the same is connected to the gate electrode of the main switching element SW. A source of the third switching element Q3 is connected to the first voltage $V_{PP}$, and a drain of the same is connected to a first electrode of the capacitor $C_{EXT}$. A source of the fourth switching element Q4 is connected to the second voltage $V_{EE}$, and a drain of the same is connected to the first electrode of the capacitor $C_{EXT}$ and to the drain of the third switching element Q3. A second electrode of the capacitor $C_{EXT}$ is connected to the gate electrode of the main switching element SW.

Each of the first and third switching elements Q1 and Q3 is a PMOSFET and has a built-in diode element. Each of the second and fourth switching elements Q2 and Q4 is an NMOSFET and has a built-in diode element. Each of the first and third switching elements Q1 and Q3 functions as a pull-up circuit. Each of the second and fourth switching elements Q2 and Q4 functions as a pull-down circuit. The third switching element Q3 and fourth switching element Q4 have respective functions of assisting the charging/discharging in the input capacitance Ciss of the main switching element SW performed by the first switching element Q1 and second switching element Q2. The capacitor $C_{EXT}$ functions as a stabilizing capacitor for preventing the false turn-on phenomenon.

The gate drive circuit according to the present embodiment includes a control circuit CTL. Each gate of the first, second, third, and fourth switching elements Q1, Q2, Q3, and Q4 is connected to the control circuit CTL. The first, second, third, and fourth switching elements Q1, Q2, Q3, and Q4 controls the turning-on/off on the control circuit CTL.

The gate drive circuit according to the present embodiment includes a gate-on resistor Rgon2, a gate-off resistor Rgoff2, a switching gate-on resistor Rgon1, a switch SWu, a switching gate-off resistor Rgoff1, and a switch SWd, as resistance elements that control the switching speed of the SiCIGBT that is the main switching element SW.

The gate-on resistor Rgon2 is connected between the drain of the first switching element Q1 and the gate electrode of the main switching element SW. The gate-off resistor Rgoff2 is connected between the drain of the second switching element Q2 and the gate electrode of the main switching element SW. The switching gate-on resistor Rgon1 and the switch SWu which are connected in parallel with each other are connected between the first voltage $V_{PP}$ and the source of the first switching element Q1. The switching gate-off resistor Rgoff1 and the switch SWd which are connected in parallel with each other are connected between the second voltage $V_{EE}$ and the source of the second switching element Q2. The switch SWu and switch SWd controls the turning-on/off on the control circuit CTL.

The gate drive circuit according to the present embodiment has resistance values which can be used independently by the turning-on/off operations, respectively, and has a configuration in which these setting resistance values can be changed by the switches. By such a configuration, the switching speed can be easily controlled. As a relationship between the resistance values and the switching speed, when the resistance values are set to be small, the switching speed can be large. Contrarily, when the resistance values are set to be large, the switching speed can be small. By the large switching speed, the input capacitance Ciss of the main switching element SW can be charged/discharged in a short time.

For example, for the operation of turning the main switching element SW on, the gate-on resistor Rgon2 and the switching gate-on resistor Rgon1 can be used. In this case, when the switch SWu connected in parallel with the switching gate-on resistor Rgon1 is turned off, the resistance value is the resistance value obtained by the sum of the resistance value of the gate-on resistor Rgon2 and the resistance value of the switching gate-on resistor Rgon1. When the switch SWu is turned on, the resistance value is only the resistance value of the gate-on resistor Rgon2.

And, for the operation of turning the main switching element SW off, the gate-off resistor Rgoff2 and the switching gate-off resistor Rgoff1 can be used. In this case, when the switch SWd connected in parallel with the switching gate-off resistor Rgoff1 is turned off, the resistance value is the resistance value obtained by the sum of the resistance value of the gate-off resistor Rgoff2 and the resistance value of the switching gate-off resistor Rgoff1. When the switch SWd is turned on, the resistance value is only the resistance value of the gate-off resistor Rgoff2.

In this manner, the present embodiment provides the gate-on resistor Rgon2 and the switching gate-on resistor Rgon1 as the turn-on resistors, and provides the gate-off resistor Rgoff2 and the switching gate-off resistor Rgoff1 as the turn-off resistors. Thus, the present embodiment provides a configuration which independently has a plurality of the turn-on resistors and a plurality of the turn-off resistors.

<Operation of Gate Drive Circuit>

Figure 8:
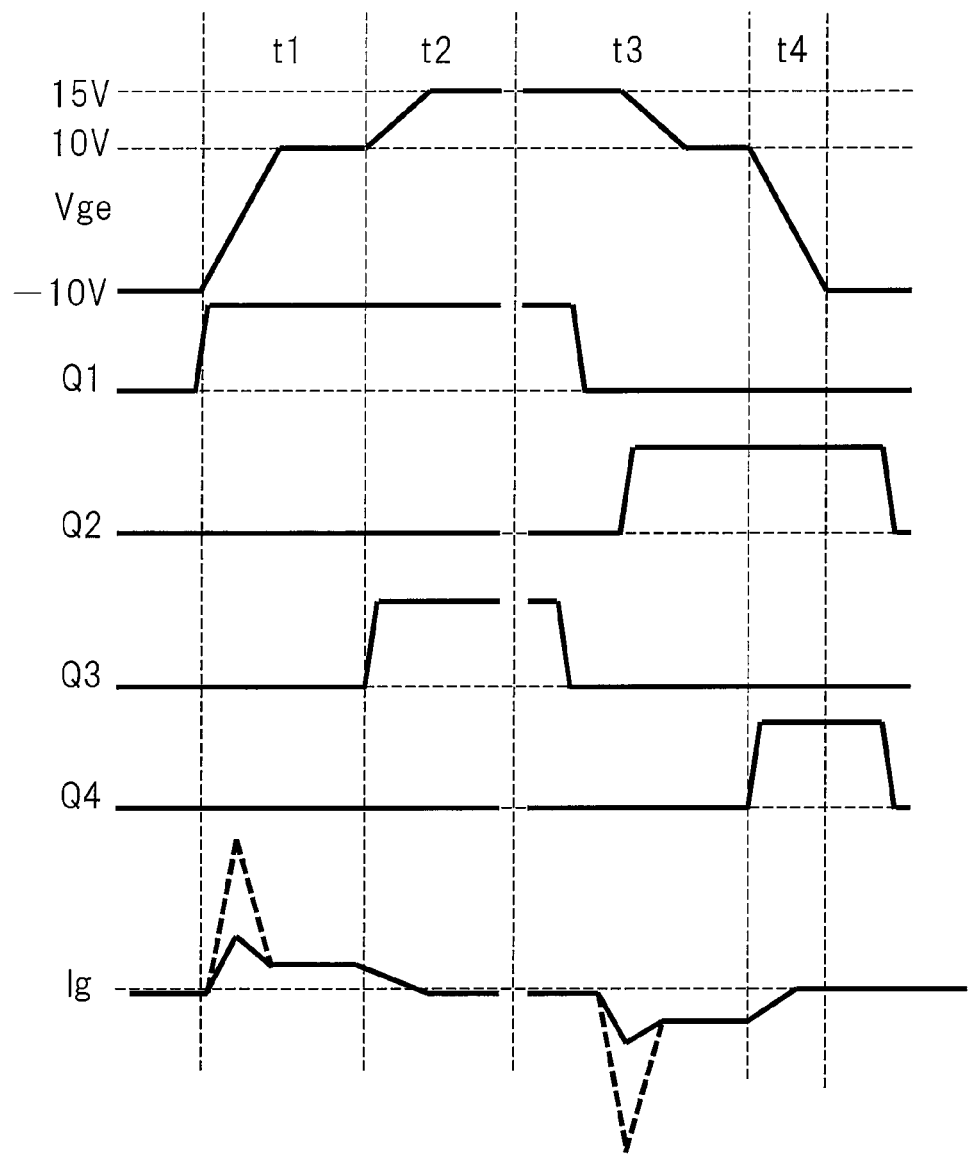
FIG. 8 is a waveform chart showing an example of a timing chart of the gate drive circuit of the embodiment.

Next, the operation of the gate drive circuit will be described with reference to FIGS. 4 to 7 and FIG. 8. FIGS. 4 to 7 are circuit diagrams showing examples of operation modes (t1 to t4) of the gate drive circuit according to the embodiment, respectively. FIG. 8 is a waveform chart showing an example of a timing chart of the gate drive circuit according to the embodiment. The operation mode (t1) shown in FIG. 4, the operation mode (t2) shown in FIG. 5, the operation mode (t3) shown in FIG. 6, and the operation mode (t4) shown in FIG. 7 are performed so as to correspond to periods t1 to t4 of FIG. 8, respectively.

When the main switching element SW is in the off-state, the four switching elements as shown in FIG. 4, i.e., first, second, third, and fourth switching elements Q1, Q2, Q3, and Q4 are all in the off-state.

In order to turn the main switching element SW on, the first switching element Q1 is turned on first as shown in FIG. 8. By the turning-on of the first switching element Q1, the charging in the input capacitance Ciss (="gate-collector capacitance Cgc" +"gate-emitter capacitance Cge") of the main switching element SW is started so as to generate a charge current Ig(Ciss). At this time, the fourth switching element Q4 is in the off-state, and therefore, a charge current in the capacitor $C_{EXT}$ which functions as the stabilizing capacitor for preventing the false turn-on phenomenon is unnecessary. As a result, as shown in the period t1 of FIG. 8, the total gate current Ig of the main switching element SW is suppressed to be small. If the capacitor $C_{EXT}$ is electrically connected between the gate and the emitter of the main switching element SW without the fourth switching element Q4, the total gate current Ig increases as shown by a broken line in FIG. 8.

The first switching element Q1 is turned on in the period t1, so that the charging in the input capacitance Ciss of the main switching element SW advances, and the gate-emitter voltage Vge of the main switching element SW increases from −10 V through a terrace period (about 10 V) to 15 V which is a desirable drive voltage. The voltage of −10 V is a voltage corresponding to the second voltage $V_{EE}$, and 15 V is a voltage corresponding to the first voltage $V_{PP}$.

As shown in FIG. 8, in the period t2 after the terrace period in the period t1, the third switching element Q3 is turned on. In this manner, as shown in FIG. 5, the third switching element Q3 assists a charge current Ig(Cext) in the capacitor $C_{EXT}$, so that the input capacitance Ciss of the main switching element SW can be charged at a high speed.

Note that a timing of the turning-on of the third switching element Q3 may be in the middle of the terrace period t1. Except for a region with a stable state of a supply current from the first voltage $V_{PP}$, that is, with the large total gate current Ig right after the turning-on of the first switching element Q1, even if the third switching element Q3 is turned on, the assist current in the capacitor $C_{EXT}$ can be stably supplied.

In order to turn the main switching element SW off, as shown in the period t3 of FIG. 8, the third switching element Q3 is turned off, and then, the first switching element Q1 is turned off while the second switching element Q2 is turned on, so that the discharging in the input capacitance Ciss of the main switching element SW is started. By such control, the capacitive value of the capacitor $C_{EXT}$ can be obtained to be apparently effectively small. As shown in FIG. 6, a discharge current Ig (Ciss) serves as a drive current, and therefore, the total gate current Ig of the main switching element SW at the turning-off start is kept small as similar to the turning-on of the main switching element SW.

As shown in FIG. 8, in the period t4 after the terrace period in the period t5, the fourth switching element Q4 is turned on. In this manner, as shown in FIG. 7, the fourth switching element Q4 assists a discharge current Ig(Cext) in the capacitor $C_{EXT}$, so that the input capacitance Ciss of the main switching element SW can be discharged at a high speed.

Note that a timing of the turning-on of the fourth switching element Q4 may be in the middle of the terrace period t3. Except for a region with a stable state of a supply current from the second voltage $V_{EE}$, that is, with the large total gate current Ig right after the turning-on of the second switching element Q2, even if the fourth switching element Q4 is turned on, the assist current in the capacitor $C_{EXT}$ can be stably supplied.

Since the fourth switching element Q4 is in the on-state after the main switching element SW is turned off, the capacitor $C_{EXT}$ functions as the stabilizing capacitor for preventing the false turn-on phenomenon. For this reason, even when main switching elements SW (SW1u, SW2U, SW1v, SW2v, SW1w, SW2w) of the opposed arms in the inverter circuit of the power conversion apparatus as described later (in FIG. 9) are turned on and off at a high speed, the stable off-state can be maintained, and therefore, the power conversion apparatus with high reliability can be provided.

As described above, by using the circuit configuration of the gate drive circuit and the operation sequence as described with reference to FIGS. 1 to 8, the gate drive current can be suppressed. As a result, the false turn-on phenomenon can be prevented.

<Power Conversion Apparatus>

Figure 9:
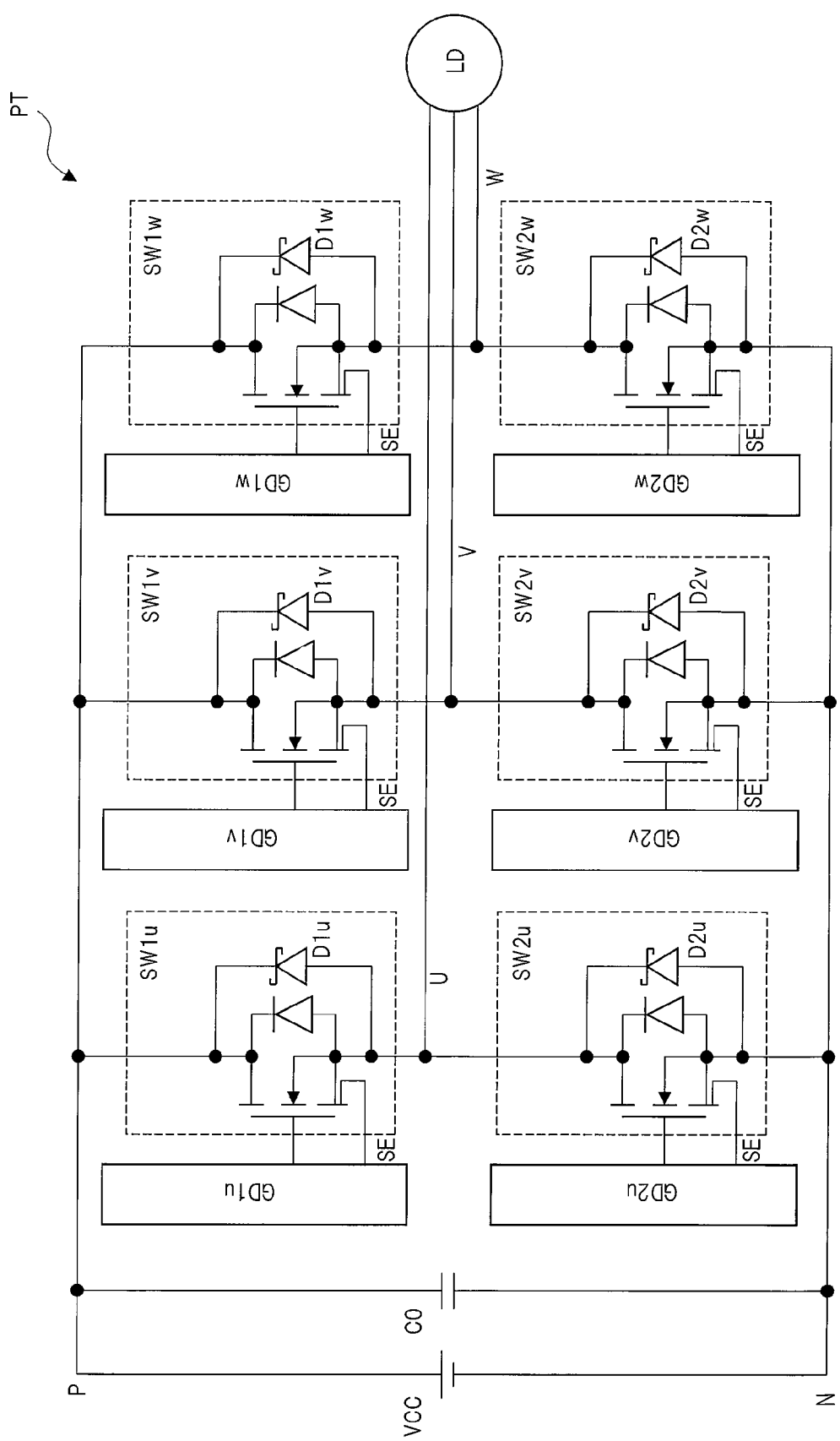
FIG. 9 is an explanatory diagram showing an example of a configuration of a power conversion apparatus according to the embodiment.

FIG. 9 is an explanatory diagram showing an example of a configuration of the power conversion apparatus according to the embodiment. In a power conversion apparatus PT shown in FIG. 9, for example, the above-described circuit configuration of the gate drive circuit and operation sequence are applied to a so-called three-phase inverter.

As shown in FIG. 9, the power conversion apparatus PT according to the present embodiment includes the switching elements (main switching elements) SW1u, SW1v, SW1w, SW2u, SW2v, and SW2w, gate drive circuits GD1u, GD1v, GD1w, GD2u, GD2v, and GD2w, a power-supply voltage VCC, a capacitor CO, and a load circuit LD.

In the power conversion apparatus PT of FIG. 9, each of the switching elements SW1u, SW1v, SW1w, SW2u, SW2v, and SW2w is a semiconductor switching element composed of an n-channel type SiCMOS. As these switching elements SW1u, SW1v, SW1w, SW2u, SW2v, and SW2w, note that a semiconductor switching element using the SiCIGBT can be also used. A transistor switch unit can be formed of the switching elements SW1u, SW1v, SW1w, SW2u, SW2v, and SW2w.

Each of reflux diode elements D1u, D1v, D1w, D2u, D2v, and D2w is connected between the source and the drain of each of the switching elements SW1u, SW1v, SW1w, SW2u, SW2v, and SW2w. Each of these reflux diode elements D1u, D1v, D1w, D2u, D2v, and D2w is formed of, for example, a Schottky barrier diode.

Each of the switching elements SW1u, SW1v, and SW1w is arranged on the upper arm side (high-voltage side P) while each of the switching elements SW2u, SW2v, and SW2w is arranged on the lower arm side (low-voltage side N). The switching elements SW1u and SW2u are for a U phase, the switching elements SW1v and SW2v are for a V phase, and the switching elements SW1w and SW2w are for a W phase. The switching elements SW1u, SW2u, SW1v, SW2v, SW1w, and SW2w are paired on the upper arm side and the lower arm side, respectively, and three paired switching elements, each pair of which are for the U phase, V phase, or W phase, are provided.

Each of the switching elements SW1u, SW1v, SW1w, SW2u, SW2v, and SW2w is provided with a sensing circuit that detects an overcurrent, an overvoltage, or a temperature of each of the switching elements although not shown.

The gate drive circuits GD1u, GD1v, GD1w, GD2u, GD2v, and GD2w are the gate drive circuits as shown in FIGS. 4 to 7, and drive the switching elements SW1u, SW1v, SW1w, SW2u, SW2v, and SW2w, respectively. As corresponded to the switching elements SW1u, SW2u, SW1v, SW2v, SW1w, and SW2w, the gate drive circuits GD1u, GD2u, GD1v, GD2v, GD1w, and GD2w are paired on the upper arm side and the lower arm side, respectively, and three paired switching elements, each pair of which are for the U phase, V phase, or W phase, are provided. Note that these gate drive circuits may be collected into a single circuit.

Upon detecting an overcurrent flowing through each switching element, an overvoltage applied to each switching element, or overheating of each switching element, the sensing circuit outputs a sense signal SE (as shown in FIGS. 4 to 7). The sense signal SE which has been output from the sensing circuit is input to the control circuit CTL of the gate drive circuit. Upon receiving the incoming sense signal SE, the control circuit CTL performs control for stopping the operations of all the switching elements.

The power-supply voltage VCC and the capacitor CO are connected between one end (drain node) of the switching element on the upper arm side and one end (source node) of the switching element on the lower arm side. The respective gate drive circuits properly turns on and off the corresponding switching elements, so that alternate-current signals with the three phases (U phase, V phase, W phase) which are different from one another are generated from the power-supply voltage VCC with a direct-current voltage. The load circuit LD is formed of, for example, a motor or others, and is properly controlled by the alternate-current signals with the three phases (U phase, V phase, W phase).

In this case, a detailed operation in the hard switching operation for each of the U-phase, V-phase, and W-phase is the same as that shown in FIG. 8 and others. In the three-phase inverter, the switching element on the upper arm side (such as the switching element SW1u) shifts to the turn-on state as the switching element on the lower arm side (such as the switching element SW2u) is in the off-state.

At this time, the drain potential (VD) of the switching element on the lower arm side (such as the switching element SW2u) increases up to a level close to the power-supply voltage VCC. When the drain potential of the switching element on the lower arm side (such as the switching element SW2u) rapidly increases, the gate potential of the switching element on the lower arm side (such as the switching element SW2u) transiently increases.

However, in the power conversion apparatus according to the present embodiment, the switching element Q4 is turned on by using the above-described gate drive circuit to connect the capacitor $C_{EXT}$ which functions as the stabilizing capacitor, and therefore, the false turn-on phenomenon at the switching element (such as the switching element SW2u) can be prevented. The gate drive current is also equalized, and therefore, scales of the gate drive circuit and the power conversion apparatus using the gate drive circuit can be reduced, so that the costs can be reduced.

The same goes for a case in which the switching element on the lower arm side is the switching element SW2v while the switching element on the upper arm side is the switching element SW1v and a case in which the switching element on the lower arm side is the switching element SW2w while the switching element on the upper arm side is the switching element SW1w.

<Alternate-Current Type Rail Vehicle>

Figure 10:
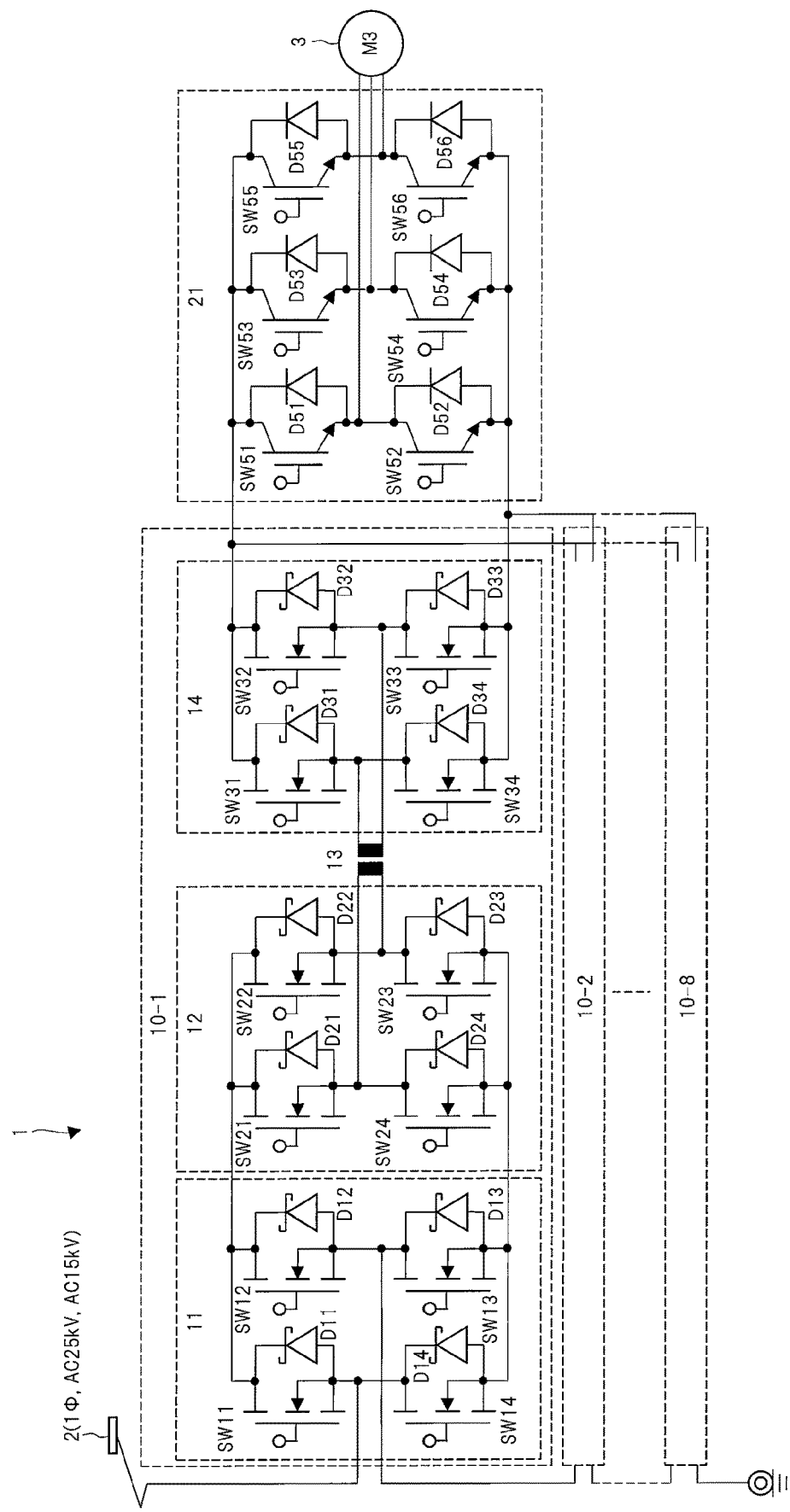
FIG. 10 is an explanatory diagram showing an example of a configuration of an alternate-current type railway vehicle according to the embodiment.

FIG. 10 is an explanatory diagram showing an example of a configuration of an alternate-current type railway vehicle according to the embodiment. FIG. 10 exemplifies a circuit diagram showing an example of a configuration of converter groups and a last-stage inverter that form a power converter in a configuration of a railway vehicle for an alternate-current overhead wire.

As shown in FIG. 10, the alternate-current type railway vehicle according to the present embodiment includes a power converter 1, a pantograph 2, and a motor (M3) 3. The power converter 1 includes converter groups 10 (10-1 to 10-8) and a last-stage inverter 21.

FIG. 10 shows an example in which, for example, each of semiconductor switching elements and semiconductor diode elements in eight-stage converter groups 10 (FIG. 10 shows a converter group 10-1 out of the converter groups 10-1 to 10-8) and a last-stage inerter 21 is made of an SiC compound material. FIG. 10 omits illustration of the gate drive circuits that drive the semiconductor switching elements of the converter groups 10 and last-stage inerter 21.

In the example of FIG. 10, the power converter 1 is used in a railway vehicle to which is supplied with a plurality of alternate-current powers from a plurality of alternate-current overhead wires are input. This drawing shows examples of, for example, AC of 25 kV and AC of 15 kV in a single phase (1φ)) as the plurality of alternate-current powers from the plurality of alternate-current overhead wires. From the plurality of alternate-current overhead wires to the plurality of converters groups 10, the alternate-current powers are supplied through the pantograph 2 which is a current collector of the railway vehicle.

An output node of each of the plurality of converter groups 10 is short-circuited, and the short-circuited node is connected to an input node of the last-stage inverter 21. The last-stage inverter 21 is the inverter that converts a direct-current power output from the short-circuited node of each of the converter groups 10, into an alternate-current power.

To the output node of the last-stage inverter 21, the motor 3 used for driving the railway vehicle is connected. This motor 3 is driven by an alternate-current power output from the last-stage inverter 21. In this case, as the motor 3, for example, a three-phase motor driven by a three-phase (3φ)) alternate-current power is exemplified.

Each converter group 10 configuring the power converter 1 includes a first converter 11, a first inverter 12, a transformer 13, and a second converter 14. The first converter 11 converts an alternate-current power supplied through the pantograph 2, into a direct-current power. The first inverter 12 converts the direct-current power converted by the first converter 11, into an alternate-current power. The transformer 13 converts the alternate-current power converted by the first inverter 12, into a predetermined alternate-current power. The second converter 14 converts the predetermined alternate-current power converted by the transformer 13, into a direct-current power. The direct-current power converted by the second converter 14 is supplied to the last-stage inverter 21, and the direct-current power is converted by the last-stage inverter 21 into an alternate-current power that drives the motor 3.

The first converter 11 is formed of switching elements SW11 to SW14 and diode elements D11 to D14. Each of the switching elements SW11 to SW14 is formed of the SiC-MOS, and each of the diode elements D11 to D14 is formed of the SiC-SBD. As similar to the first inverter 12 and the second converter 14, each of switching elements SW21 to SW24 and SW31 to SW34 is formed of the SiCMOS, and each of diode elements D21 to D24 and D31 to D34 is formed of the SiC-SBD.

On the other hand, the last-stage inverter 21 which is connected to the short-circuited output node of each converter group 10 is formed of switching elements SW51 to SW56 and diode elements D51 to D56, each of the switching elements SW51 to SW56 is formed of the SiCIGBT, and each of the diode elements D51 to D56 is formed of the SiC-PND. It is desirable to form each of the switching elements SW51 to SW56 and the diode elements D51 to D56 of the last-stage inverter 21 from a compound material. However, each of them can be formed from a silicon material.

In this manner, in the power conversion apparatus 1 shown in FIG. 10, each of the switching elements of the converter groups 10 is formed of a unipolar element having a wide band gap, and each of the switching elements of the last-stage inverter 21 is formed of a bipolar element having a wide band gap. As a power device material, attention is paid to a compound semiconductor such as SiC or GaN having a band gap larger than that of silicon. Each of these compound semiconductor has a large band gap, and therefore, has a breakdown voltage that is about 10 times as high as a breakdown voltage of silicon. For this reason, a compound device is allowed to have a film thickness smaller than that of a Si device, and to have a significantly-low resistance value (Ron) at the time of conduction. As a result, so-called conduction loss (Ron×$i^2$) expressed by a product of the resistance value (Ron) and the conduction current (i) can be reduced, and this manner can significantly contribute to improvement of the power efficiency. As attention is paid to such advantages as achieving the high breakdown voltage and the low conduction loss, the switching elements and the diode elements using the compound materials are used in the power converter 1 according to the present embodiment.

Contrivance is performed so as to use elements which are different in a type between the switching elements of the converter groups 10 and the switching elements of the last-stage inverter 21. For example, by the usage of the unipolar elements as the switching elements of the converter groups 10, an operation at a high frequency with a small switching loss can be achieved. The unipolar element has a high input impedance, and therefore, and has advantages which allows a weak voltage to be amplified with less noises and which has a high breakdown voltage. Meanwhile, by the usage of the bipolar elements for the switching elements of the last-stage inverter 21, a large current can be supported.

When these switching elements are driven, the gate drive circuit according to the present embodiment has the small gate drive current, and therefore, can easily perform the high-frequency operation of the converter groups 10. Further, the false turn-on phenomenon during the high-speed switching operation can be prevented, and therefore, reliability of electrical components which are under-floor components of the railway vehicle can be increased.

In the foregoing, the invention made by the inventors of the present invention has been concretely described based on the embodiments. However, it is needless to say that the present invention is not limited to the foregoing embodiments, and various modifications and alterations can be made within the scope of the present invention.

That is, it is needless to say that, if objects such as the reduction in the gate drive current, the prevention of the false turn-on phenomenon, and the reduction in the power loss are achieved, various modifications can be made within the scope of the present invention.

As each switching element, a compound device made of not only silicon carbide (SiC) but also gallium nitride (GaN) may be applicable. When the compound material is used as each switching element of the inverter or others, it is needless to say that the power loss of the inverter can be reduced by usage of the switching element together with the gate drive circuit.

It is needless to say that the same effects can be obtained in the application of the power conversion apparatus according to the present embodiment to power systems for various types of usage. Typically, inverters of air conditioners, DC/DC converters of server power supplies, power conditioners of photovoltaic power systems, inverters of hybrid/electric cars, and others are cited.

Note that the present invention is not limited to the above-described embodiments, and includes various modification examples. For example, the above-described embodiments have been explained for easily understanding the present invention, but are not always limited to the one including all structures explained above.

Also, a part of the structure of one embodiment can be replaced with the structure of another embodiment, and besides, the structure of another embodiment can be added to the structure of one embodiment. Further, another structure can be added to/eliminated from/replaced with a part of the structure of each embodiment.

EXPLANATION OF REFERENCE CHARACTERS 1 power converter
2 pantograph
3 motor
10 (10-1 to 10-8) converter group
11 first converter
12 first inverter
13 transformer
14 second converter
21 last-stage inverter SW switching element
D diode element
Q1, Q2, Q3, Q4 switching element
$C_{EXT}$ capacitor
$V_{PP}$ voltage
$V_{EE}$ voltage
CTL control circuit
SW1u, SW1v, SW1w, SW2u, SW2v, SW2w switching element
D1u, D1v, D1w, D2u, D2v, D2w diode element
GD1u, GD1v, GD1w, GD2u, GD2v, GD2w gate drive circuit
SW11 to SW14, SW21 to SW24, SW31 to SW34, SW51 to SW56 switching element
D11 to D14, D21 to D24, D31 to D34, D51 to D56 diode element

The invention claimed is:

1. A gate drive circuit driving a main switching element, comprising:
a first switching element;
a second switching element;
a third switching element;
a fourth switching element;
a capacitor and
a control circuit controlling the first switching element, the second switching element, the third switching element, and the fourth switching element,
wherein a driving timing of the third switching element and the fourth switching element controlled by the control circuit is after a terrace period of the main switching element,
a source of the first switching element is connected to a first voltage, and a drain of the first switching element is connected to a gate electrode of the main switching element,
a source of the second switching element is connected to a second voltage, and a drain of the second switching element is connected to the gate electrode of the main switching element,
a source of the third switching element is connected to the first voltage, and a drain of the third switching element is connected to a first electrode of the capacitor,
a source of the fourth switching element is connected to the second voltage, and a drain of the fourth switching element is connected to the first electrode of the capacitor and to the drain of the third switching element, and
a second electrode of the capacitor is connected to the gate electrode of the main switching element.

2. The gate drive circuit according to claim 1,
wherein the third switching element functions as a pull-up circuit, and
the fourth switching element functions as a pull-down circuit.

3. The gate drive circuit according to claim 1,
wherein the third switching element is a PMOSFET, and has a built-in diode element, and
the fourth switching element is an NMOSFET, and has a built-in diode element.

4. The gate drive circuit according to claim 3,
wherein the first switching element is a PMOSFET, and has a built-in diode element, and
the second switching element is an NMOSFET, and has a built-in diode element.

5. The gate drive circuit according to claim 1 further comprising
a turn-on resistor and a turn-off resistor which are independent of each other,
wherein the turn-on resistor is connected between the drain of the first switching element and the gate electrode of the main switching element, and
the turn-off resistor is connected between the drain of the second switching element and the gate electrode of the main switching element.

6. The gate drive circuit according to claim 1 further comprising
each of a plurality of turn-on resistors and a plurality of turn-off resistors,
wherein a first turn-on resistor of the turn-on resistors is connected between the drain of the first switching element and the gate electrode of the main switching element,
a second turn-on resistor of the turn-on resistors is connected between the source of the first switching element and the first voltage,
a first turn-off resistor of the turn-off resistors is connected between the drain of the second switching element and the gate electrode of the main switching element, and
a second turn-off resistor of the turn-off resistors is connected between the source of the second switching element and the second voltage.

7. The gate drive circuit according to claim 6,
wherein the second turn-on resistor is connected in parallel with a turn-on switch,
a resistance value becomes a resistance value obtained by a sum of a resistance value of the first turn-on resistor and a resistance value of the second turn-on resistor when the turn-on switch is turned off, and the resistance value becomes a resistance value of the first turn-on resistor when the turn-on switch is turned on,
the second turn-off resistor is connected in parallel with a turn-off switch, and
the resistance value becomes a resistance value obtained by a sum of a resistance value of the first turn-off resistor and a resistance value of the second turn-off resistor when the turn-off switch is turned off, and the resistance value becomes a resistance value of the first turn-off resistor when the turn-off switch is turned on.

8. The gate drive circuit according to claim 1,
wherein, in order to turn the main switching element on, the first switching element is turned on, and then, the third switching element is turned on, while each of the second switching element and the fourth switching element is in a turn-off state, and,
in order to turn the main switching element off, the second switching element is turned on, and then, the fourth switching element is turned on, while each of the first switching element and the third switching element is in a turn-off state.

9. The gate drive circuit according to claim 8,
wherein charging in an input capacitance of the main switching element is started by turning the first switching element on, and then, the charging in the input capacitance of the main switching element is assisted by turning the third switching element on, and
discharging in the input capacitance of the main switching element is started by turning the second switching element on, and then, the discharging in the input capacitance of the main switching element is assisted by turning the fourth switching element on.

10. A power conversion apparatus comprising:
three paired first main switching elements and second main switching elements, each pair of which are for a U phase, a V phase, or a W phase, and each pair of which are connected in series between a power supply on a high-voltage side and a power supply on a low-voltage side; and three paired first gate drive circuits and second gate drive circuits, each pair of which are for the U phase, the V phase, or the W phase, and each pair of which alternately turn each of the three paired first and second main switching elements on and off, wherein each of the first gate drive circuits and the second gate drive circuits includes:
a first switching element;
a second switching element;
a third switching element;
a fourth switching element; and
a capacitor, a source of the first switching element is connected to a first voltage, and a drain of the first switching element is connected to a gate electrode of the first main switching element or to a gate electrode of the second main switching element, a source of the second switching element is connected to a second voltage, and a drain of the second switching element is connected to the gate electrode of the first main switching element or to the gate electrode of the second main switching element, a source of the third switching element is connected to the first voltage, and a drain of the third switching element is connected to a first electrode of the capacitor, a source of the fourth switching element is connected to the second voltage, and a drain of the fourth switching element is connected to the first electrode of the capacitor and to the drain of the third switching element, and a second electrode of the capacitor is connected to the gate electrode of the first main switching element or the gate electrode of the second main switching element.

11. A railway vehicle having a power converter driving a three-phase motor, wherein the power converter includes an inverter converting a direct-current power, which has been created by converting an alternate-current power input from an alternate-current overhead wire, into an alternate-current power to be supplied to the three-phase motor, the inverter includes:
three paired first main switching elements and second main switching elements, each pair of which are for a U phase, a V phase, or a W phase, and each pair of which are connected in series between a power supply on a high-voltage side and a power supply on a low-voltage side; and three paired first gate drive circuits and second gate drive circuits, each pair of which are for the U phase, the V phase, or the W phase, and each pair of which alternately turn the three paired first and second main switching elements on and off, and each of the first gate drive circuits and the second gate drive circuits includes:
a first switching element;
a second switching element;
a third switching element;
a fourth switching element; and
a capacitor, a source of the first switching element is connected to a first voltage, and a drain of the first switching element is connected to a gate electrode of the first main switching element or to a gate electrode of the second main switching element, a source of the second switching element is connected to a second voltage, and a drain of the second switching element is connected to the gate electrode the first main switching element or to the gate electrode of the second main switching element, a source of the third switching element is connected to the first voltage, and a drain of the third switching element is connected to a first electrode of the capacitor, a source of the fourth switching element is connected to the second voltage, and a drain of the fourth switching element is connected to the first electrode of the capacitor and to the drain of the third switching element, and a second electrode of the capacitor is connected to the gate electrode of the first main switching element or to the gate electrode of the second main switching element.

12. The railway vehicle according to claim 11, wherein the power converter includes a plurality of converter groups each including:
a first converter converting the alternate-current power, which has been input from the alternate-current overhead wire, into the direct-current power;

a first inverter converting the direct-current power, which has been converted by the first converter, into an alternate-current power;

a transformer converting the alternate-current power, which has been converted by the first inverter, into a predetermined alternate-current power; and a second converter converting the alternate-current power, which has been converted by the transformer, into a direct-current power, and each output of the plurality of converter groups is short-circuited, and is connected to an input of the inverter converting the direct-current power into the alternate-current power to be supplied to the three-phase motor.

* * * * *